United States Patent
Marsh et al.

(10) Patent No.: US 7,030,032 B2
(45) Date of Patent: Apr. 18, 2006

(54) PHOTODIODE PASSIVATION TECHNIQUE

(75) Inventors: Philbert Francis Marsh, Andover, MA (US); Colin Steven Whelan, Wakefield, MA (US)

(73) Assignee: Raytheon Company, Waltham, MA (US)

( * ) Notice: Subject to any disclaimer, the term of this patent is extended or adjusted under 35 U.S.C. 154(b) by 293 days.

(21) Appl. No.: 10/437,095

(22) Filed: May 13, 2003

(65) Prior Publication Data

US 2004/0229469 A1 Nov. 18, 2004

(51) Int. Cl.
*H01L 21/302* (2006.01)

(52) U.S. Cl. .................. 438/745; 438/754; 257/444

(58) Field of Classification Search ............. 438/745, 438/749, 752, 754; 257/438, 444, 462
See application file for complete search history.

(56) References Cited

U.S. PATENT DOCUMENTS

| | | | |
|---|---|---|---|
| 5,434,426 A * | 7/1995 | Furuyama et al. | 250/551 |
| 5,489,798 A * | 2/1996 | Doguchi et al. | 257/458 |
| 5,599,748 A | 2/1997 | Holloway et al. | |
| 5,689,125 A | 11/1997 | Vaccaro et al. | |
| 5,796,127 A | 8/1998 | Hayafuji et al. | |
| 5,863,412 A * | 1/1999 | Ichinose et al. | 205/652 |
| 6,133,815 A | 10/2000 | Guckel et al. | |
| 6,197,667 B1 | 3/2001 | Chang et al. | |
| 6,380,097 B1 | 4/2002 | Dauplaise et al. | |
| 6,448,119 B1 | 9/2002 | Onda | |
| 6,724,010 B1 * | 4/2004 | Kwasnick et al. | 257/59 |
| 6,730,979 B1 * | 5/2004 | Boisvert | 257/438 |
| 6,791,160 B1 * | 9/2004 | Ejiri et al. | 257/577 |
| 6,835,969 B1 | 12/2004 | Marsh et al. | |
| 2004/0262632 A1 | 12/2004 | Marsh et al. | |

FOREIGN PATENT DOCUMENTS

| | | | |
|---|---|---|---|
| EP | 0 469 606 A2 | | 5/1992 |
| EP | 0 498 993 A2 | | 8/1992 |
| EP | 0 498 993 A3 | | 8/1992 |
| EP | 0 614 233 A2 | | 9/1994 |
| EP | 0 614 233 A3 | | 9/1994 |
| EP | 0614233 | * | 9/1994 |
| EP | 1 189 087 A2 | | 3/2002 |

OTHER PUBLICATIONS

PCT International Search Report, PCT/US2004/015073, Oct. 15, 2004.

Enoki et al., Design and characteristics of InGaAS/InP Composite-Channel HEFT's, EEI Transactions on Electron Devices, vol. 42, No. 8, Aug. 1995, 0018-9383/95: pp. 413-418.

(Continued)

*Primary Examiner*—Kin-Chan Chen
(74) *Attorney, Agent, or Firm*—Daly, Crowley, Mofford & Durkee, LLP (57) ABSTRACT

A method for passivating a photodiode so as to reduce dark current, $I_{sdark}$, due to the exposed semiconductor material on the sidewall of the device. The method includes etching away sidewall surface damage using a succinic acid-hydrogen peroxide based sidewall etch. This is followed by a subsequent hydrochloric acid (HCl)-based surface treatment which completes the surface treatment and reduces the dark current $I_{sdark}$. Finally, a polymer coating of benzocyclobutene (BCB) is applied after the surface treatment to stabilize the surface and prevent oxidation and contamination which would otherwise raise the dark current were the diodes left with no coating. The BCB is then etched away from the contact pad areas to allow wirebonding and other forms of electrical contact to the diodes. Such method effectively stabilizes the etched surfaces of photodiodes resulting in significantly reduced and stable dark current.

8 Claims, 5 Drawing Sheets

OTHER PUBLICATIONS

Hoke et al., Molecular Beam Epitaxial Growth and Device Performance of Metamorphic High Electron Mobility Transistor Structures Fabricated on GaAs Substrates, J. Vac. Sci. Technol. B 17(3), May/Jun. 1999, American Vacuum Society, 0734-211X/99/71(3)/1131/5, pp. 1131-1135.

Whelan et al., GaAs Metamorphic HEMT (MHEMT), An Attractive Alternative to InP HEMTs for High Performance Low Noise and Power Applications, 2000 IEEE 1-7803-6320-5-00: pp. 337-340.

delAlamo et al., Breakdown in Millimeter-Wave Power InP HEMT's, A Comparison with GaAs PHEMT's, IEEE Journal of Solid-State Circuits, vol. 34, No. 9, Sep. 1999, 0018-9200/99, pp. 1204-1221.

PCT/US 03/33763 PCT International Search Report dated Dec. 17, 2002.

R. Kwok, et al., Gas Phase Polysulfide Passivation of InP for MISFET Fabrication, Indium Phosphide and Related Materials, 1993, Conference Proceedings, Fifth International Conference, May 1993, PP. 369-371.

V.L. Berkovits, V.M. Lantratov, T.V. L'Vova, G.A. Shakiashvili and V.P. UUN, Liquid-Phase Epitaxy on AlxGa1-xAs Surfaces Passivated in Solfide Solutions, Semiconductors 28 (3), Mar. 1994, Page(s) 260-265.

PCT/US 03/33763 PCT International Search Report dated Jun. 18, 2004.

Haruhiro Oigawa et al., Studies on an (NH4) 2SX-Treated GaAs Surface Using AES, LEELS and RHEED, Japanese Journal of Applied Physics pp. 340-342 vol. 28, No. 3, Mar. 1, 1989.

A. Kapila and V. Malhorta, Surface Passivation of III-V Compound Semiconductors, Optoelectronic and Microelectronic Materials and Devices Proceedings, 1996 Conference on, 1998 pp. 275-282.

A. Kapila and V. Malhorta, Passivation of the InP Surface Using Polysulfide and Silicon Nitride Overlayer, Applied Physics Letters, vol. 62, No. 9, Mar. 1, 1993, pp. 1009-1011.

* cited by examiner

PRIOR ART

FIG. 1A

PRIOR ART

PHOTODIODE PASSIVATION TECHNIQUE

TECHNICAL FIELD

This invention relates to semiconductor devices, and more particularly to methods for passivating such semiconductor devices.

BACKGROUND

Figure 1A:
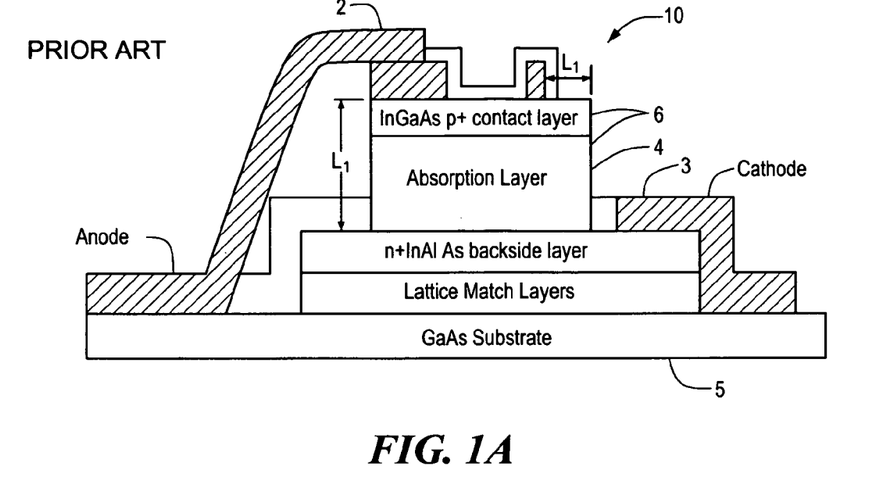
FIGS. 1A and 1B are cross-sectional side and top views, respectively, of a photodiode according to the PRIOR ART, the cross-section of FIG. 1A being taken along line 1A—1A of FIG. 1B.
Figure 1B:
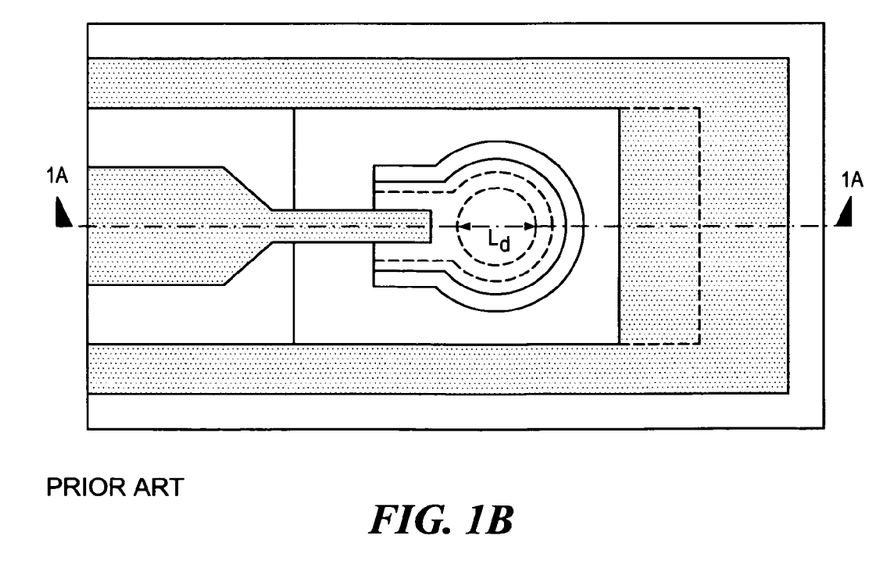

As is known in the art, one type of semiconductor device is a photodiode as shown in FIGS. 1A and 1B. As is also known in the art, such devices are typically used for converting amplitude modulated light signals in fiber optics to electrical currents which represent digital or analog information. For example, data might be modulated on a light source at a rate of 40 billion binary digits/sec (40 Gb) with a "1" being represented by the light being on and a "0" represented by the light being off. Since the photodiode's current output is proportional to the intensity of illumination on the photodiode, ideally, the current waveform will be a representation of the digital data carried by the light.

These photodiodes, such as photodiode 1 in FIGS. 1A and 1B convert light, having a wavelength near 1.55 µm, to hole-electron pairs (carriers) which result in an electrical current, Id flow between the anode pad 2 and the cathode pad 3. Under illumination, hole-electron generation occurs mostly in the absorption layer 18. In order to efficiently convert 1.55 µm wavelength photons to carriers, the absorption layer 18 must have a bandgap which is less than that of the photon energy. During operation, the photodiode's anode 2 is biased at a negative voltage with respect to the cathode 3. This bias voltage, $V_d$, results in an electrical field which separates the holes and electrons. Up to a point, the higher the $V_d$ and the electrical field, the faster the electrons and holes (carriers) move. High carrier velocity is needed for high switching speed implying the need for a higher $V_d$. However, if $V_d$ is too high, the diode can break down resulting in burnout and/or a large component of Id that is unrelated to illumination, i.e. dark current, $I_{dark}$. In any event, $I_{dark}$ normally increases with $V_d$. Photodiodes, used here for 1.55 µm wavelength detection, use an $In_{.53}Ga_{.47}As$ absorption layer to provide a good compromise between absorption (i.e., relatively high In content) and good breakdown and low dark current characteristics (i.e., relatively low In content).

Photodiodes are rated according to several figures of merit. These include responsivity, R; dark current, $I_{dark}$; and breakdown voltage, $V_{br}$. In addition, when illumination levels are changing rapidly e.g. the light source is switching on and off at a very high rate, say in a 40 Gb optical data link; the time required for the photodiode current to change with the illumination might be a significant portion of the optical pulsewidth, $T_w$. The ability for the photodiode's current to keep up with rapidly changing illumination levels is related to the 3 dB bandwidth of the photodiode, $f_c$. When the illuminating light source power amplitude is varied sinusoidally with time at a frequency, $f_{op}$, the diode current ($I_d$) also varies sinusoidally in accordance with the illumination. Let $P_{ac}$ be the variation of the optical power level where $P_{ac}=P_{max}-P_{min}$ where the optical power varies between a high of $P_{max}$ to a low of $P_{min}$. Also let $I_{dac}=I_{dmax}-I_{dmin}$ where $I_{dac}$ is the difference in the high ($I_{dmax}$) and low ($I_{dmin}$) values of $I_d$. Also define the responsivity, $R_{ac}$, as $I_{dac}/P_{ac}$. If $P_{ac}$ is held constant, $I_{dac}$ will remain nearly constant for low values of $f_{op}$. However $I_{dac}$ and $R_{ac}$ fall as $f_{op}$ approaches $f_c$. At $f_{op}=f_c$, $R_{ac}$ is 0.707 times its value at low $f_{op}$, i.e. $R_{ac}$ is 3 dB down from its low-frequency value. A high $f_c$ is desirable because this implies that the photodiode current is able to follow the rapid changes in illumination level required for high-speed data and/or analog optical links. High values of $R_{ac}$ are desirable because this reduces the optical power, $P_{ac}$ needed to produce diode current, $I_{dac}$.

Dark current ($I_{dark}$) is the photodiode current measured with no illumination. It is desirable to minimize $I_{dark}$ because it contributes an error signal and noise to the $I_d$ when the photodiode is used to detect light. A major component of dark current arises when generated holes and electrons are separated by the electric field due to the anode bias and appear at the photodiode terminals as current. $I_{dark}$ sources can also arise from conductive leakage paths on the diode's surface.

$I_{dark}$ has two physically contributing effects namely surface current, $I_{sdark}$ and bulk current, $I_{bdark}$, such that $I_{dark}=I_{bdark}+I_{sdark}$. $I_{bdark}$ is the dark current that originates from within the absorption layer 18 and $I_{sdark}$ is that which originates from the photodiode's sidewall surface 6. While a small amount of $I_{bdark}$ is also generated from the natural hole-electron pair production processes in those portions of the absorption layer that are flawless, crystal defects in the absorption layer 18 and surface 6 act as generation centers which are prolific sources of hole-electron pairs. $I_{sdak}$ can also arise from surface 6 contamination and leakage. FIGS. 1A and 1B show respectively the cross-sectional and top views of a metamorphic photodiode 1 on a GaAs substrate 12. However, these photodiodes could also be grown on InP substrates. The current state of semiconductor technology allows the growth of high-quality photodiode material using both lattice-matched and metamorphic substrates. This means that the majority of dark current, especially in small-diameter photodiodes, is due not to bulk effects, but rather the sidewall surface 6 of the photodiode 1. The sidewall surface 6 contributes most of $I_{dark}$, especially in small devices and is highly dependent on the fabrication technology used to make the photodiode 1. For instance, if the photodiodes' anode mesas 4 are formed using dry etching, the sidewall surface 6 often comes out with large numbers of crystal defects (damage) due to its exposure to the energetic gas ions inherent in dry etching processes. This damage results in high $I_{sdark}$ and $I_{dark}$. Not only are the high values of dark current undesirable but contaminated and/or damaged sidewall surface 6 can also result in sudden failures due to anode to cathode short circuits which appear under anode bias.

Alternatively, the photodiodes' anode mesas 4 can also be formed using water-based etchants, i.e. wet etching processes. Wet etching results in an insignificant level of damage to the sidewall surface 6 and might help to reduce $I_{sdark}$ as a result. Unfortunately, oxidation and contamination of the photodiode surface 6 can also contribute to $I_{sdark}$. Also, wet etching is generally isotropic, meaning that the etch rate is the same in all directions. The resulting undercut during etching makes it difficult to fabricate photodiodes which have a small $L_1$ (FIG. 1A) relative to the anode mesa 4 thickness, $L_t$. It is desirable to minimize $L_1/L_t$, especially for small photodiode diameters ($L_d$) because the photodiode area represented by $L_1$ does not contribute to photo-generated current, $I_{dac}$, but does increase the photodiode's capacitance and hence reduces the photodiode's $f_c$ and its ability to follow rapid changes in illumination.

Therefore, dry etching is often used because it etches vertically with very little undercutting and sideways etching, allowing minimization of $L_1$. Therefore, some kind of sidewall surface 6 treatment must be incorporated in the diode process to remove the damaged material, oxidation, and/or surface contamination, so as to obtain acceptable values of dark current, $I_{sdark}$.

SUMMARY

In accordance with the present invention, a method is provided for passivating a photodiode so as to reduce dark current, $I_{sdark}$, due to the exposed semiconductor material on the sidewall 6 of the device. The method includes first etching away sidewall surface damage. This is followed by a hydrochloric acid (HCl)-based surface treatment which is effective in reducing dark current. Finally, a polymer coating of benzocyclobutene (BCB) is applied after the surface treatment to stabilize the surface and prevent oxidation and contamination which would otherwise raise the dark current were the diodes left with no coating. The BCB is then etched away from the pad areas to allow wirebonding and other forms of electrical contact to the diodes.

Such method effectively stabilizes the etched surfaces of photodiodes resulting in significantly reduced dark current.

DETAILED DESCRIPTION

Referring now to FIGS. 2A–2G, the process for forming a photodiode semiconductor device is accordance with the invention is shown. Thus, referring to FIG. 2A, diode layers 14, 16, 18 and 20 are grown on a metamorphic GaAs or InP substrate 12. Here, layer 16 is an n+$In_{0.52}Al_{0.48}$ As backside layer and layer 14 is an InAlGaAs layer. Layer 14 is used to lattice match the layer 16 to the substrate 12 and is included only when GaAs substrates are used. Layer 14 is not used on diodes having InP substrates. Layer 18 is an $In_{0.53}Ga_{0.47}As$ absorption layer which converts the incident light into hole-electron pairs. Layer 20 is a p+ InGaAs anode contact ohmic layer.

Figure 2A:
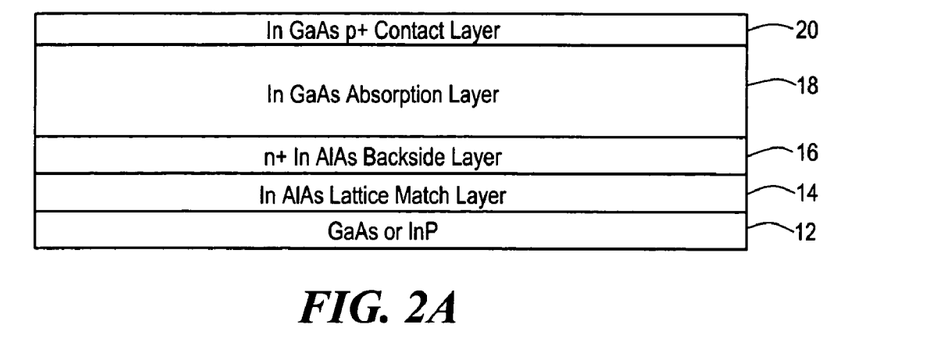
FIGS. 2A–2G cross-sectional sketches of a photodiode fabricated in accordance with the invention at various stages in such fabrication.
Figure 2B:
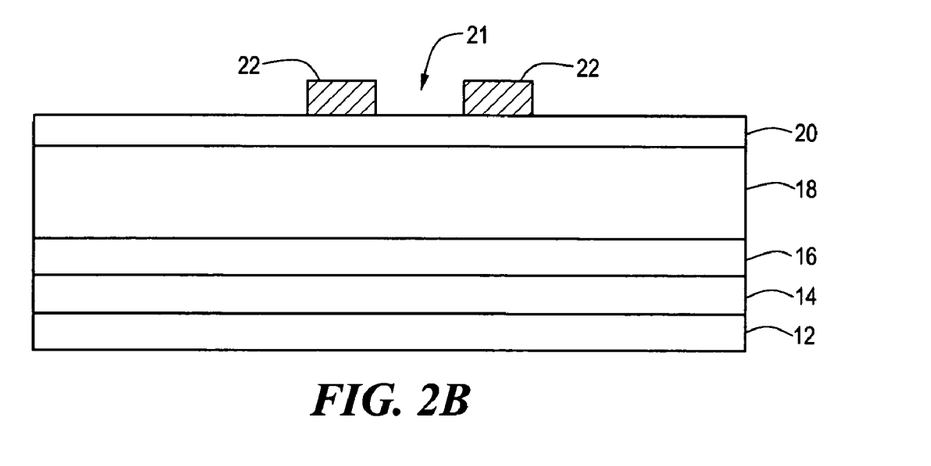

Next, referring to FIG. 2B, p+ ohmic metal layer 22 is deposited over the layer 20 and is patterned into a ring-shaped structure, such ring having an aperture 21 therein using conventional photolithographic etching techniques. The aperture 21 is free of metal, and allows light to enter through the p+ InGaAs ohmic layer, 20, into the InGaAs absorption layer. Next, referring to FIG. 2C, a dielectric and anti-reflection coating layer 24, here silicon nitride, is deposited over the surface of the structure shown in FIG. 2B. It is noted that portions of the deposited layer 24 are disposed on the portion of the layer 20 within the aperture 21.

Figure 2C:
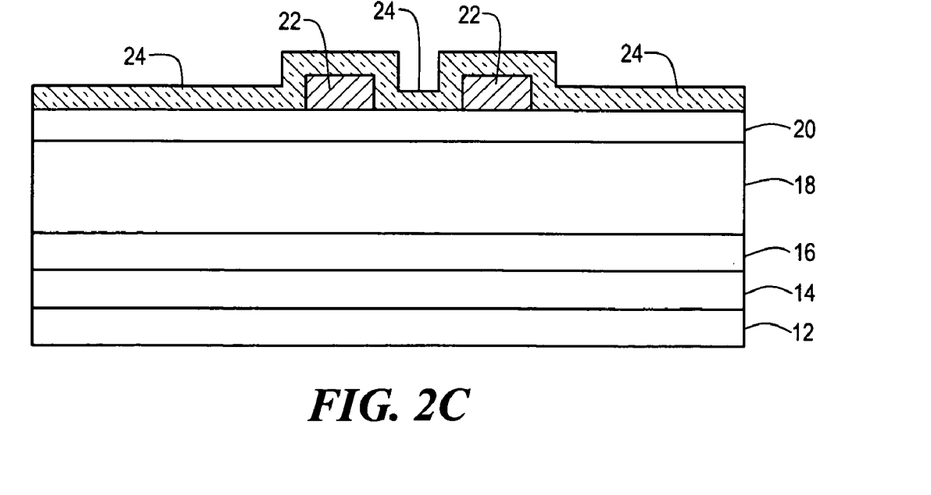
Figure 2D:
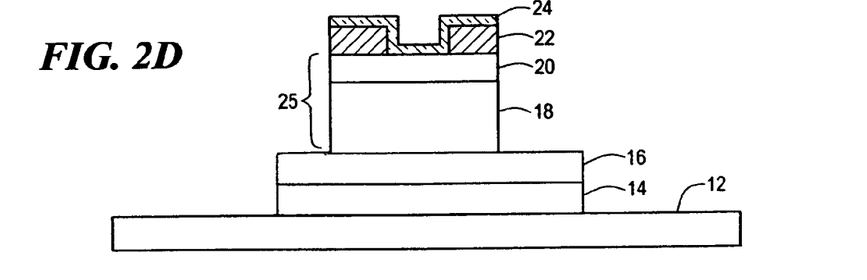

Next, referring to FIG. 2D, the photodiode anode mesa 25 is either dry-etched or wet etched into the structure shown in FIG. 2C, such mesa 25 having portions of p+ ohmic contact layer 20 and underlying portions of the absorption layer 18. Dry etching results in the outer sidewall surfaces of the anode mesa 25 having large numbers of crystal defects (damage) due to its exposure to the energetic gas ions inherent in dry etching processes. Both wet and dry etched surfaces can accumulate oxidation and contamination products over time. Crystal defects and/or surfltce oxidation/contamination can result in significant increases in dark current.

Figure 2E:
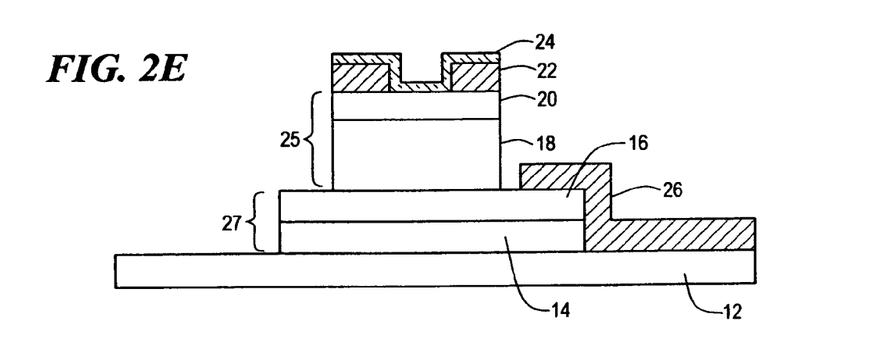

Next, referring to FIG. 2E, the cathode mesa 27 is etched into the structure shown in FIG. 2D. The cathode mesa serves to electrically isolate the photodiode cathodes from each other and future metal structures. The cathode metal 26 is then deposited to provide electrical contact to layer 16 of the photodiode cathode mesa 27.

Figure 2F:
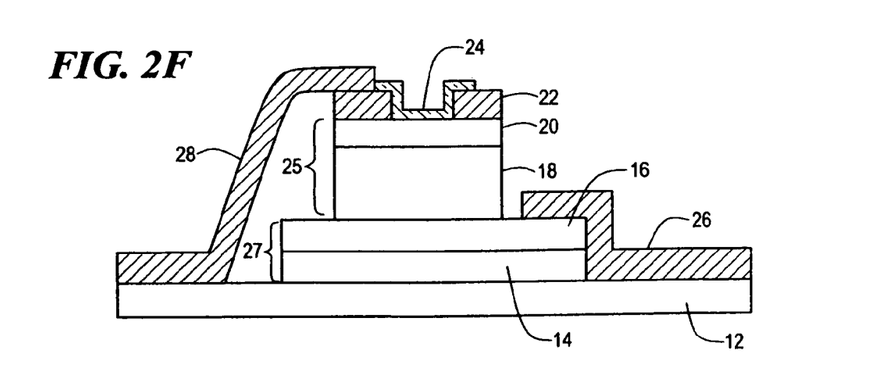

Next, referring to FIG. 2F, a conductive airbridge 28 is fabricated to provide electrical contact to the p+ ohmic metal rings 22 which are in ohmic contact with the anode p+ layer 20. The substrate 14 may be thinned and via holes are added (if necessary) and metalized.

Next, the diode structure is treated with the passivation etch in accordance with the invention. More particularly, the first step involves a selective etch of the anode mesa 25 using a mixture of a succinic acid solution which has its pH adjusted to 5.2 (hereafter called SA) and a 30% solution of ammonium hydroxide and water (hereafter called NH$_4$OH). The SA is prepared by mixing 200 g of solid succinic acid with 1000 ml deionized water (hereafter called H$_2$O). The NH$_4$OH is stirred into the SA while monitoring the pH of the solution, until the pH=5.2. Solubility of succinic acid increased as NH$_4$OH was added and pH increased. As NH$_4$OH is added, an increasing proportion of the succinic acid dissolves, and at pH=5.2, nearly all the succinic acid is dissolved. During preparation of the SA, a waiting period is included after each addition of NH$_4$OH to allow the succinic acid solution to reach equilibrium before the pH is measured. When the pH is satisfactory, i.e. within pH=5.1–5.35, then the SA is filtered by drawing it through a filter paper. The resulting filtered succinic acid solution (SA) is ready to be used in creating the sidewall etchant.

The etchant used to etch portions of the sidewalls 6 of anode mesa 4 is prepared by mixing 6 parts of SA, prepared as described above, with 1 part of a 30% solution of hydrogen peroxide in water (hereafter called H$_2$O$_2$). The sidewall etchant should be used within about 1 hr 30 min of mixing the SA and H$_2$O$_2$. The sidewall etchant described here etches the sidewall 6 of $In_{0.53}Ga_{0.47}As$ layers 18 and 20 at approximately 600 Å/min while its etch rate of $In_{.52}A_{.48}As$ layer 16 is under 10 Å/min. The low etch rate of $In_{0.52}Al_{0.48}As$ layer 16 reduces the undesired etching of the n+ InAlAs layer 16 that interfaces to the n+ cathode metal layer 26. Etching of layer 16 would result in an increase of the photodiode's resistance which would increase the response time of the photodiode to an optical pulse signal. The layer 24 of silicon nitride (SiNx) covers the top of the anode mesa 4 and the p+ ohmic metal layer 22. The SiNx layer 24 coating prevents the sidewall etchant from undercutting the p+ ohmic metal 22 and also serves as an antireflection coating to improve the efficiency of light transfer from air to the absorption layer 18 of the photodiode.

Thus, the photodiode is first subjected to an etch, consisting of the volume ratio of 6 parts SA with 1 part $H_2O_2$, for 1 min. The pH of this solution is 5.1–5.3. This etch removes a few hundred Angstroms from the semiconductor surfaces including all damaged semiconductor and contamination products from the anode mesa 4 sidewalls 6.

This $SA:H_2O_2$ etch is then followed with a 30 sec HCl: $H_2O$ etch where the $HCl:H_2O$ solution is prepared by mixing a concentrated HCl solution with $H_2O$ in the volume ratio of 5 parts concentrated HCl solution with 95 parts $H_2O$. The concentrated HCl solution is a 37–38% solution of HCl in water.

Figure 2G:
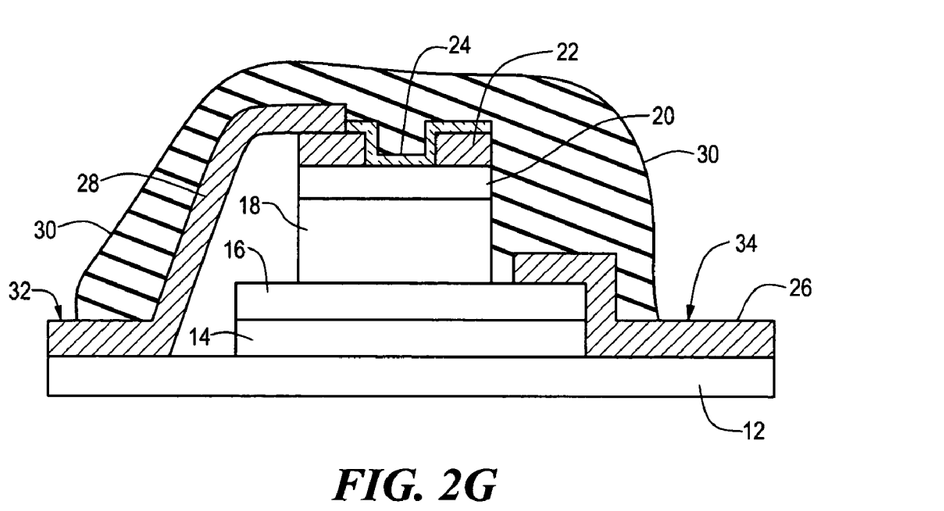

Referring now to FIG. 2G, as part of the passivation, the diode can be optionally coated with a layer 30 of a polymer coating, here benzocyclobutene (BCB) manufactured by Dow chemical Cyclotene 4024-40. The BCB is thinned using a BCB solvent, i.e. T 1100 from Dow Chemical, before application to the photodiode wafer.

More particularly, immediately following the HCl treatment, the photodiodes are then spin coated with BCB:BCB solvent solution consisting of the volume ratio of 1 part BCB to 5 parts T 1100 BCB solvent. Both chemicals were obtained from Dow Chemical. This BCB solution is spun on the wafer at 4000 RPM for 60 sec. The BCB coating is then cured in a vacuum oven at 250 C for 1 hour. The BCB coating can be removed from the photodiode contact pads (2 and 3) by patterning with photoresist and etching the BCB. Etching of the BCB is accomplished using a photoresist mask and dry etch. The procedure which describes the patterning of the BCB coating 30 process, according to the invention, follows below:

1. Spin on Shipley 1827 photoresist at 2800 RPM for 60 sec spin time.
2. Softbake 115 C on a hotplate.
3. Expose with pad mask (UV light on pad regions) at 400 nm wavelength and 600 $mJ/cm^2$.
4. Develop photoresist mask using Microposit MF319 1 min 15 sec, rinse in deionized $H_2O$, and blow-dry with $N_2$.
5. Etch BCB in a reactive ion etcher using the following gas flows, RF power, chamber pressure, and etch time respectively: 20 SCCM $O_2$, 5 SCCM $NF_3$, 50 W RF, 100 mT pressure. Etch for 2 min.
6. Apply an oxygen plasma descum for 10 min, strip photoresist mask in acetone 5 min, followed by a squirt of acetone from the bottle, followed by 5 min dip in isopropanol, an isopropanol squirt from the bottle and $N_2$ blow-dry.

Now, the BCB layer 30 is removed from diode pads 2 and 3 to allow external electrical contact to the diode and the photodiode is ready to test.

In most photodiodes dark current often rises slightly with time as the photodiode is held under bias. Surface defects and contamination often result in high initial dark current and/or a dark current that drifts rapidly upward with time under bias. The passivation technique described by the invention reduces both the dark current and its upward drift with time as illustrated by comparing FIGS. 3 and 4.

Figure 3:
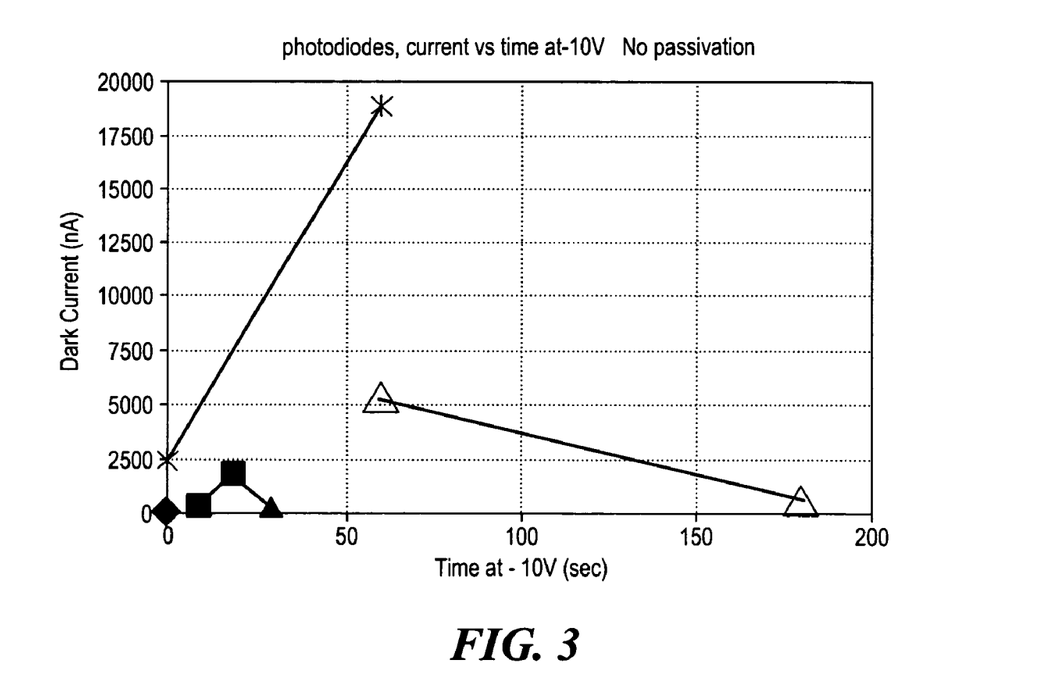
FIG. 3 is a plot of the dark current of several untreated photodiodes as a function of time when biased at −10 V anode to cathode.
Figure 4:
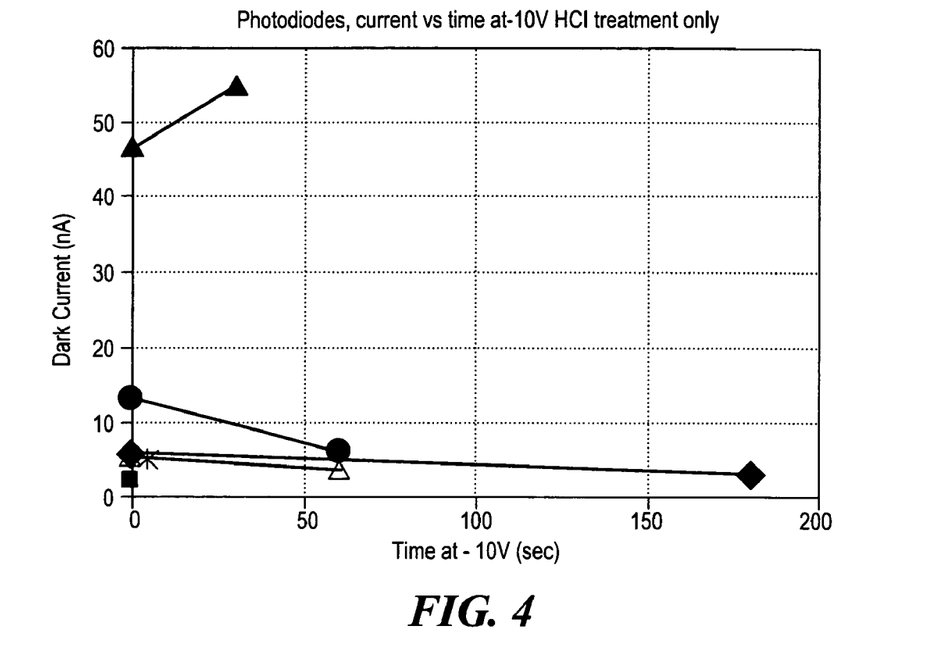
FIG. 4 is a plot of the dark current of several photodiodes from the same wafer as those in FIG. 3 except here the diode sidewalls were etched with a solution having succinic acid and subsequently treated with hydrochloric acid in accordance with the process of FIGS. 2A–2F.

FIG. 3 is a plot of the dark current curves of several untreated photodiodes as a function of time when biased at room temperature with −10 V from anode to cathode. The photodiodes of FIG. 3 had no surface treatment and were left in air for several months. FIG. 4 is a plot of the dark current of several photodiodes from the same wafer as those in FIG. 3 except here such wafers were tested less than a day after having their sidewalls etched and treated with the SA and HCl solutions as described above in connection with the process of FIGS. 2A–2F.

Figure 5:
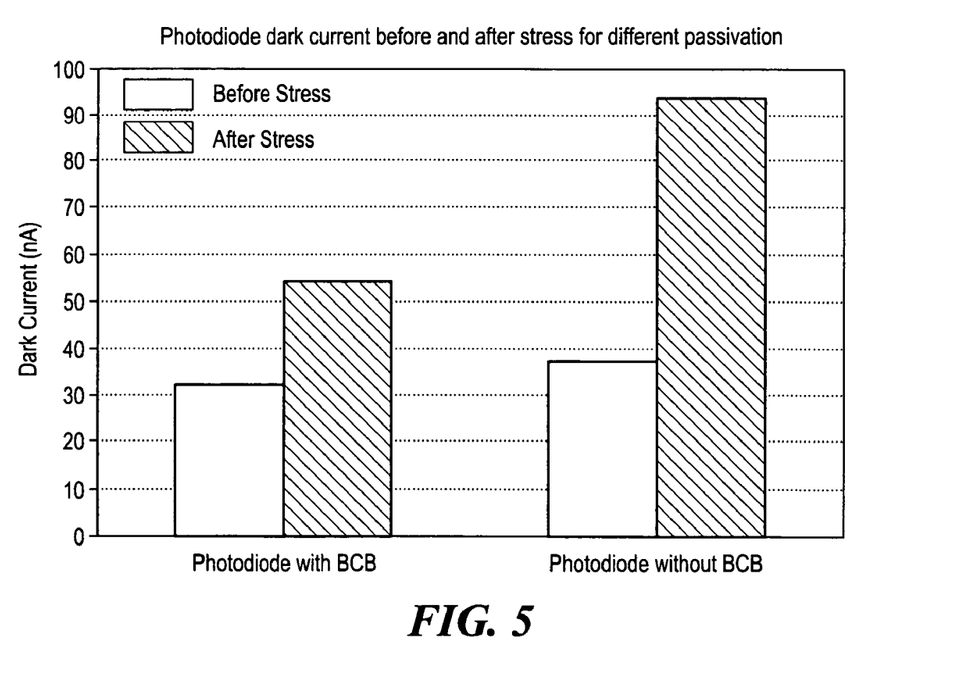
FIG. 5 is a comparison of photodiodes having a sidewall with the succinic acid solution and subsequent hydrochloric (HCl) etch in accordance with the process of FIGS. 2A–2F compared with those having the sidewall etch and HCl treatment followed by a benzocyclobutene (BCB) coating and curing procedure in accordance with the process described in connection with FIG. 2G

FIG. 5 shows the benefit of having the BCB coating applied after the sidewall SA etch and HCl treatment described in accordance with FIGS. 2A–2G. Here, photodiodes were stressed by biasing them at −10 V (normal bias for optical detection is −5 V to −10 V) while holding them at 150 C in air for 65 hours. More particularly, FIG. 5 shows dark current increasing less in photodiodes that have the BCB coating as opposed to those that had only the sidewall $SA:H_2O_2$ and $HCl:H_2O$ etches described above but with no coating.

Thus, FIG. 4 shows dark current for photodiodes that have had the sidewall SA etch and HCl treatment described in accordance with FIGS. 2A–2F. Such diodes show much lower dark currents and lower dark current drift. While the surface etch and treatment reduces dark currents, it provides little long-term protection from sidewall contamination and oxidation—both of which will raise dark current with time and/or stress. Therefore, the surface etch and treatments need to be followed by a procedure which encapsulates the photodiode and seals the sidewalls against oxygen and other contaminates. Such is the purpose of the BCB coating and curing as described in the invention in accordance with FIG. 2G.

To test the effectiveness of the BCB coating, two sets of photodiodes, from the same wafer, were fabricated with the first set having only the sidewall etch and HCl treatment and the next having the sidewall etch and HCl treatment followed by the BCB deposition as described in the invention. All devices receiving only the sidewall etch and HCl treatment were baked at 200 C for 15 min in a vacuum oven immediately following the HCl treatment. Devices getting the BCB coating were coated right after the HCl treatment and then baked after the BCB coating at 250 C for 1 hour in the vacuum oven as described in the invention.

Thus, FIG. 5 is a comparison of photodiodes having a sidewall etch and HCl treatment in accordance with the process of FIGS. 2A–2F compared with those having the sidewall etch and HCl treatment followed by a BCB coating and curing procedure in accordance with the process described in connection with FIG. 2G Photodiodes lacking the BCB coating were baked at 200 C in a vacuum oven following the HCl treatment whereas those coated with BCB were coated immediately after drying off the HCl treatment. The BCB was then cured at 250 C in a vacuum oven for an hour. Photodiodes were stressed by holding them at 150 C in air under −10 V anode to cathode bias for 65 hours. The photodiodes were then cooled to room temperature and the dark current was measured at −10 V anode bias after holding the anode at −10 V for 1 min.

Other embodiments are within the spirit and scope of the appended claims.

What is claimed is:

1. A method for treating a photodiode structure, comprising:
   (a) providing the photodiode structure, such structure having:
      an InAlAs cathode mesa;
      an InGaAs anode mesa disposed on the cathode mesa, such anode mesa having:
      an absorption layer over the cathode mesa; and
      a contact layer over the absorption layer; and (b) subjecting the provided photodiode structure to an etching process, such etching process comprising subjecting the photodiode structure to a solution having hydrochloric acid, to remove portions of the absorption layer at a rate substantially greater than the rate such etching process removes portions of the cathode mesa to selectively remove portions of an outer surface of the anode mesa.

2. The method recited in claim 1 wherein the subjecting comprises:
   (a) subjecting the photodiode structure to a first solution; and
   (b) subsequently subjecting the photodiode structure with a second solution, such second solution having hydrochloric acid.

3. The method recited in claim 2 wherein the first solution includes succinic acid.

4. The method recited in claim 3 including providing a polymer coating over the structure subsequently to such structure having the etching process performed on such structure.

5. The method recited in claim 4 wherein the coating is benzocyclobutene.

6. The method recited in claim 1 wherein the subjecting comprises subjecting the structure to a solution having succinic acid.

7. The method recited in claim 6 including providing a polymer coating over the structure subsequently to such structure having the etching process performed on such structure.

8. The method recited in claim 7 wherein the coating is benzocyclobutene.

* * * * *

UNITED STATES PATENT AND TRADEMARK OFFICE
CERTIFICATE OF CORRECTION

PATENT NO. : 7,030,032 B2 Page 1 of 1
APPLICATION NO. : 10/437095
DATED : April 18, 2006
INVENTOR(S) : Philbert Francis Marsh et al.

It is certified that error appears in the above-identified patent and that said Letters Patent is hereby corrected as shown below:

Column 1, line 26 delete "Id flow" and replace with --$I_d$ flow--.

Column 1, line 39 delete "Id" and replace with --$I_d$--.

Column 2, line 26 delete "$I_{sdak}$" and replace with --$I_{sdark}$--.

Column 3, line 30 delete "FIGS. 2A-2G cross-sectional" and replace with
--FIGS. 2A-2G are cross-sectional--.

Column 3, line(s) 52-53 delete "is accordance with the invention is shown" and replace with -- is in accordance with the invention as shown.--.

Column 4, line 16 delete "surfltce" and replace with --surface--.

Column 6, line 45 delete "FIG. 2G Photodiodes" and replace with --FIG. 2G. Photodiodes--.

Signed and Sealed this

Fifteenth Day of August, 2006

JON W. DUDAS
*Director of the United States Patent and Trademark Office*